US006433985B1

(12) United States Patent
Voldman et al.

(10) Patent No.: US 6,433,985 B1
(45) Date of Patent: Aug. 13, 2002

(54) ESD NETWORK WITH CAPACITOR BLOCKING ELEMENT

(75) Inventors: Steven H. Voldman, South Burlington; Richard Q. Williams, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/476,244

(22) Filed: Dec. 30, 1999

(51) Int. Cl.$^7$ .............................. H02H 3/22; H02H 1/00
(52) U.S. Cl. .......................... 361/113; 361/111; 361/56
(58) Field of Search ...................... 361/113, 56, 111; 307/102, 105, 106, 108; 327/306, 309, 310, 311

(56) References Cited

U.S. PATENT DOCUMENTS

| | | |
|---|---|---|
| 5,041,889 A | 8/1991 | Driedt et al. |
| 5,173,755 A * | 12/1992 | Co et al. ..................... 257/361 |
| 5,290,724 A | 3/1994 | Leach |
| 5,625,522 A * | 4/1997 | Watt ........................... 361/111 |
| 5,631,793 A * | 5/1997 | Ker et al. ..................... 361/56 |
| 5,701,024 A | 12/1997 | Watt |
| 5,717,560 A | 2/1998 | Doyle et al. |
| 5,721,656 A | 2/1998 | Wu et al. |
| 5,731,941 A | 3/1998 | Hargrove et al. |
| 5,818,086 A | 10/1998 | Lin et al. |
| 5,825,600 A | 10/1998 | Watt |
| 5,946,177 A * | 8/1999 | Miller et al. .................. 361/56 |
| 6,038,116 A * | 3/2000 | Holberg et al. ............... 361/56 |
| 6,040,968 A * | 3/2000 | Duvvury et al. .............. 361/56 |

OTHER PUBLICATIONS

IBM Technical Disclosure Bulletin, vol. 30, No. 8, Jan. 1988 pp. 389–390.

* cited by examiner

Primary Examiner—Kim Huynh
(74) Attorney, Agent, or Firm—Eugene I. Shkurko; Mark F. Chadurjian

(57) ABSTRACT

An ESD protection network is described which prevents high voltage oxide stress. The network consists of a filter network (such as a blocking capacitor) and diode protection elements. The filter network can be designed for several types of ESD protection functions. It can be designed to provide voltage reduction for ESD pulses, and to selectively block the frequency components of ESD pulses.

10 Claims, 5 Drawing Sheets

ESD NETWORK WITH CAPACITOR BLOCKING ELEMENT

FIELD OF THE INVENTION

This invention pertains to electrostatic discharge (ESD) protection circuits. In particular, this invention pertains to an ESD protection network with a series blocking capacitor element to prevent overvoltage of a thin dielectric receiver gate structure by blocking ESD caused voltage spikes.

BACKGROUND OF THE INVENTION

As CMOS technology dimensions are scaled down, electrostatic discharge events become more disruptive and more difficult to control. Thinner dielectrics become more susceptible to damage from ESD events and the protective circuits themselves are constrained due to size limitations. Another difficulty arises due to the increased operational frequencies of IC chips which approach typical frequency levels of ESD events. Attenuating and/or shunting ESD frequency spectra while simultaneously passing information signals becomes a challenge when designing useful ESD protection networks. The present invention is directed to providing an ESD protection network that reduces voltage levels of ESD pulses, and to selectively block frequency components of ESD pulses.

SUMMARY OF THE INVENTION

An ESD protection network is described which prevents high voltage oxide stress. A first embodiment consists of a filter network (such as a series blocking capacitor) and diode protection elements. The general ESD network described is shown in FIG. 1. The illustrated filter network can be designed for several types of ESD protection functions. It can be designed to provide voltage reduction for ESD pulses, and to selectively block the frequency components of ESD pulses.

An IC chip having an input that may be subjected to an ESD event is an environment where the present invention can be usefully implemented. The present ESD protection network is coupled to an IC input for attenuating an ESD event occurring on the input node and for passing to the IC chip received input signals. The ESD protection network includes a series capacitor between the input and the IC chip receiver for attenuating the ESD frequencies.

Any devices that include components susceptible to overvoltage stress caused by an ESD event could also usefully implement the present inventive protection network. An ESD event that generates frequencies lower than an operational frequency of a device can be shunted or substantially attenuated by a series capacitor coupled between a node undergoing an ESD event and the device while passing operational frequencies of the device.

Other features and advantages of this invention will become apparent from the following detailed description of the presently preferred embodiment of the invention, taken in conjunction with the accompanying drawings.

BEST MODE FOR CARRYING OUT THE INVENTION

Figure 1:
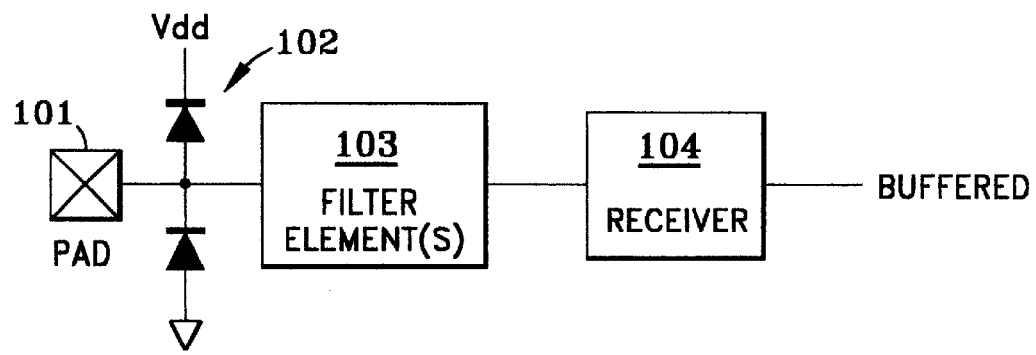
FIG. 1 illustrates a generalized circuit structure of the present invention.

In reference to FIG. 1, a fundamental embodiment of the present invention includes a pad 101 of an IC chip that may be subjected to an ESD event, an ESD protective network 102, a secondary ESD (filter) network 103 including a capacitor in series with a receiver network 104 or other peripheral on-chip I/O circuitry to be protected from the ESD event. The filter circuit 103 having only a series capacitor is the simplest embodiment. In operation, the capacitor structure limits the voltage stress on the receiver gate structure. At pulses of 1 nanosecond to 10 nanoseconds or longer, the blocking capacitor can reduce the voltage on the receiver gate allowing for the diode elements to have more time to shunt the current to the power supply. A modification of this circuit may include the addition of a capacitor, resistor or inductor between the pad and the protective network 102.

The ESD protective network 102 can be comprised of any commonly known diode elements. For example, these elements may include a Schottky diode, a p-i-n diode, a varactor diode, a Mott diode, or a silicon p-n diode. Note that the elements included in ESD protective network 102 can be other known elements in diode-like configurations. For example, these may include bulk silicon diodes and silicon-on-insulator (SOI) diodes. The diode elements can also be bipolar transistors (homojunction or heterojunction), or MOSFETs in commonly known diode configurations. The example heterojunction diode can include any known semiconductor compound (GaAs or silicon germanium, for example) in a configuration such as an emitter-base, base-collector, or collector-substrate junction. For example, in SOI, this can be a body-to-drain or body-to-source diode. The diode can be a body-to-gate coupled dynamic threshold SOI diode (body, gate and drain is the anode and source is the cathode). The ESD network 102 can be connected as a plurality of diodes in series or parallel configuration.

The receiver network 104 can include NFET half-pass transistors, NFET/PFET full-pass networks, secondary ESD networks, resistor elements and feedback elements. As further examples, the receiver network 104 can include a resistor followed by a second stage of double-diode ESD elements; a resistor and grounded-gate NFET; an RC-triggered MOSFET, or PFET feedback elements, overvoltage clamps, and active clamp circuits elements.

Figure 2:
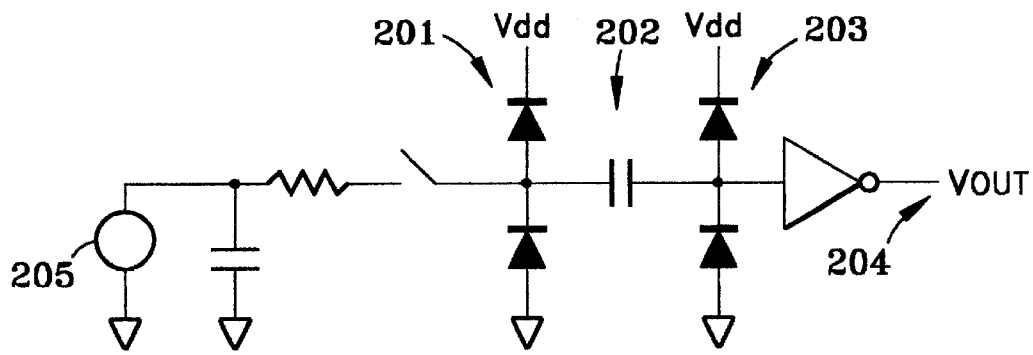
FIG. 2 illustrates a filter network for reduction of ESD pulse amplitude.

In reference to generalized FIG. 2, shown is another embodiment having a first ESD primary stage, i.e. a first ESD network 201, followed by at least one series capacitor network 202 followed by a secondary ESD network 203. In both ESD networks, a simple model is illustrated having a double diode network with each diode coupled to a supply voltage. The primary ESD network 201 serves as a means to discharge ESD current ($I_{zap}$) from the input pad to the power supply Vdd. The capacitor structure is in series with the capacitor in the receiver 204 (the receiver capacitor is a device gate, thus, the receiver could be demonstrated as a gate) reducing the voltage seen on the receiver network. The secondary ESD element stage 203 is demonstrated as a double diode network (which could also be a grounded gate NFET alone, or with a diode to Vdd, or triple/double diode to power rails as in this case). The secondary network can be used to provide charged device model (CDM) protection capability to prevent damage to the receiver network when subjected to an ESD event.

On a high level, the series capacitor is an element suitable for a functional response at very high frequencies, where the receiver is operational at the high frequencies, i.e. the ESD event is a lower frequency event than the operational frequency level of the receiver. The role of the blocking capacitor is to look like a low impedance short relative to the receiver to allow the functional signals to propagate into the receive network with minimal performance degradation. On the other hand, at frequencies lower than the operational frequencies, the role of the filter or blocking capacitor is to reduce the amount of signal that gets to the receiver in the lower frequency regime.

In the charge device model (CDM) pulse, the human body model (HBM), and machine model (MM) pulses, the frequencies are below approximately 5 Ghz, thus, it's intended that the frequency response of the blocking capacitor is effective in shunting frequencies at those levels. These models represent the types of ESD events that may occur on the pad. The MM pulse consists of a 5 ns risetime, the HBM pulse consists of a 22 ns risetime and a 150 ns decay, the CDM pulse is effectively a pulse from inside the chip coming out of the pin whose speed is approximately a 250 ps risetime. The energy and spectral frequency of an ESD event is such that there is no energy contained in the event spectrum above approximately 4 to 5 Ghz. The entire energy spectrum is this regime, and this is the regime in which the blocking capacitor is effective as an impedance blocking element in series with the receiver. At frequencies greater than approximately 5 Ghz, the signal is propagated through to the receiver network.

The different models described above can be constructed using the circuit of FIG. 2 as follows:

HBM: a 100 pF capacitor (charged) in series with 1500 ohm resistor, then closing the switch.

CDM: charge the chip or physical package to a given voltage then ground one of the pins. The charge is coming from the inside of the chip (the substrate or Vdd side). The substrate is typically charged or grounded and the charge pulse can impact the receivers. There is a discharge path in this situation back through the substrate and the receiver gates. For the CDM effect, the shunt capacitor is in series with the capacitor of the receiver gate, preventing that current path (from receiver gate through the shunt) from occurring, so the current will flow through the grounds, up through Vdd, and through the double diode networks. The second stage prevents the current flowing through the receiver gate and directs it through a diode. The first stage directs the current though the diode to ground and out through the pad. The blocking capacitor is acting as a series impedance with the receiver gate so that the current doesn't flow through the receiver gate out to the pad directly.

MM: 200 pF capacitor (charged), then closing an ideal switch.

Figure 3:
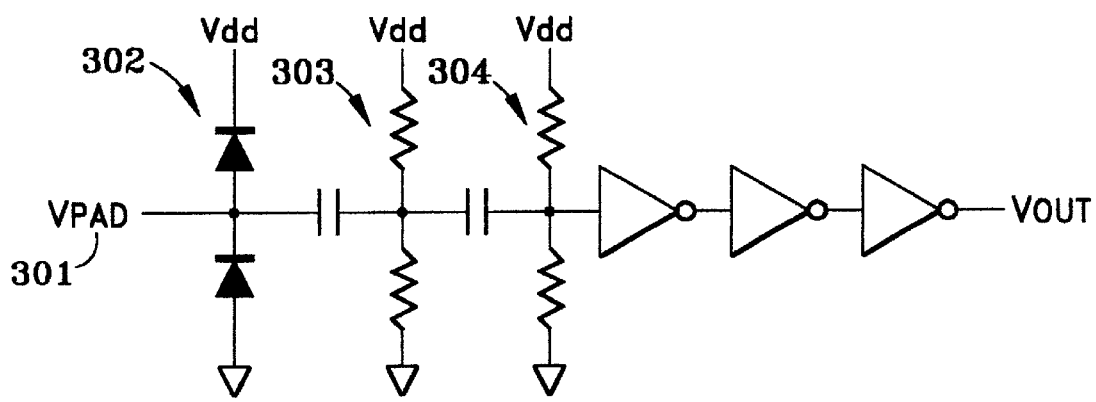
FIG. 3 illustrates another embodiment of the present invention.
Figure 5:
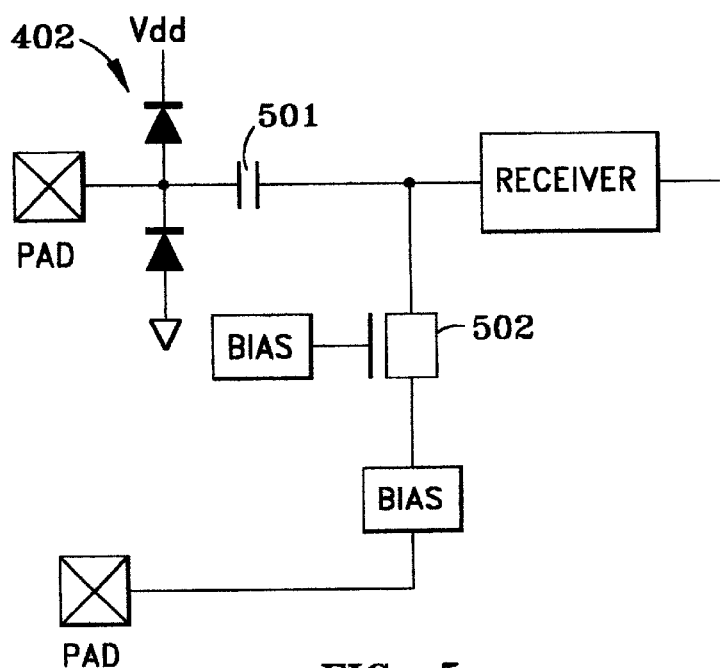
FIG. 5 illustrates an additional embodiment of the present invention.

In reference to FIG. 3, illustrated is another embodiment including a pad 301, a first ESD element stage 302 followed by a plurality of capacitor and resistor networks in series with the receiver network acting as filtering elements for these different frequencies. A first capacitor, selected in size ranging from about 1 pF to about 100 pF, is followed by two resistors 303, selected in size ranging from about 1000W to about 10 kW, a second capacitor is followed by two resistors 304. The diodes are typically greater than 50 microns in perimeter. This circuit is tunable based on a desired time constant. An FET element here, such as illustrated in FIG. 5, would be advantageous. The resistors could be FETs, poly, N diffusion, salicided, unsalicided, Nwells, or metal wires (e.g. tungsten). The FET would provide different resistance values. This embodiment is useful for a filter network implemented to selectively pass digital signals (in the GHz regime) while blocking ESD transient frequencies (approximately 10's of MHz). This network could also be altered to provide a frequency-dependent phase delay for ESD frequencies while providing minimum delay at switching frequencies. More complex embodiments might include NFETs and resistor elements as well.

Figure 4:
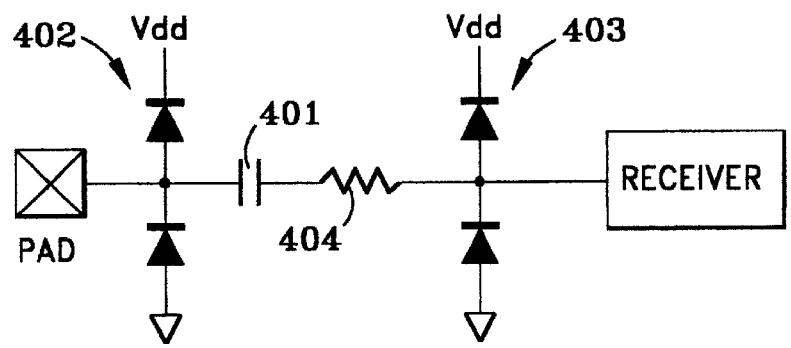
FIG. 4 illustrates yet another embodiment of the present invention.

In reference to the circuit shown in FIG. 4, the capacitor network places a series element 401 to avoid low voltage stressing of the receiver gate structure. Additionally, the capacitor network at frequencies above 1 nanosecond to 10 nanosecond range acts as an impedance blocking element allowing the first stage of diodes 402 to carry away the low frequency component of the ESD pulse from the pad. The second stage 403 acts as a clamp for the high frequency component of the pulse. In this implementation, the first stage carries a majority of the low frequency current. The second stage provides a shunt for the high frequency component, thus, these second stage diodes can be made physically smaller by a factor of approximately 3. The structure also acts as a resistor divider with the series resistance element 404 for lowering the voltage at the receiver gate structure. For CDM failure mechanisms which has ESD components in the 1 to 10 GHz regime, the resistor acts as the high frequency blocking element in series with the receiver gate structure. The series blocking capacitor will establish additional impedance back to the pad structure. The second stage diodes will act as a bypass current path allowing the current to flow to the Vdd power supply or Vss power supply. The series blocking capacitor will act as a blocking capacitor for CDM pulses depending on the Z(w) dependence of the capacitor network.

FIG. 5 illustrates one alternate embodiment using the series capacitor 501 of the present invention. An FET 502 with appropriate bias can be used to replace resistors. The implementation here uses a reference network (bias network) that keeps the FET in the off region.

Figure 6:
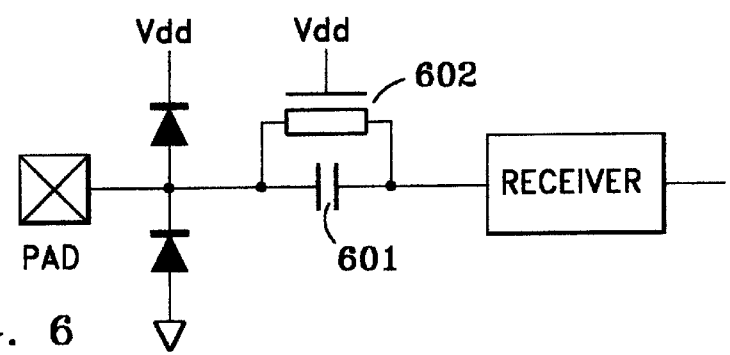
FIG. 6 illustrates another additional embodiment of the present invention.

FIG. 6 illustrates a bypass in parallel to the series capacitor 601, which, in functional mode, activates a pass transistor 602 (the bypass element), allowing the signal to propagate. In an ESD mode, the bypass element is off, having the capacitor serve as a blocking element.

Figure 7:
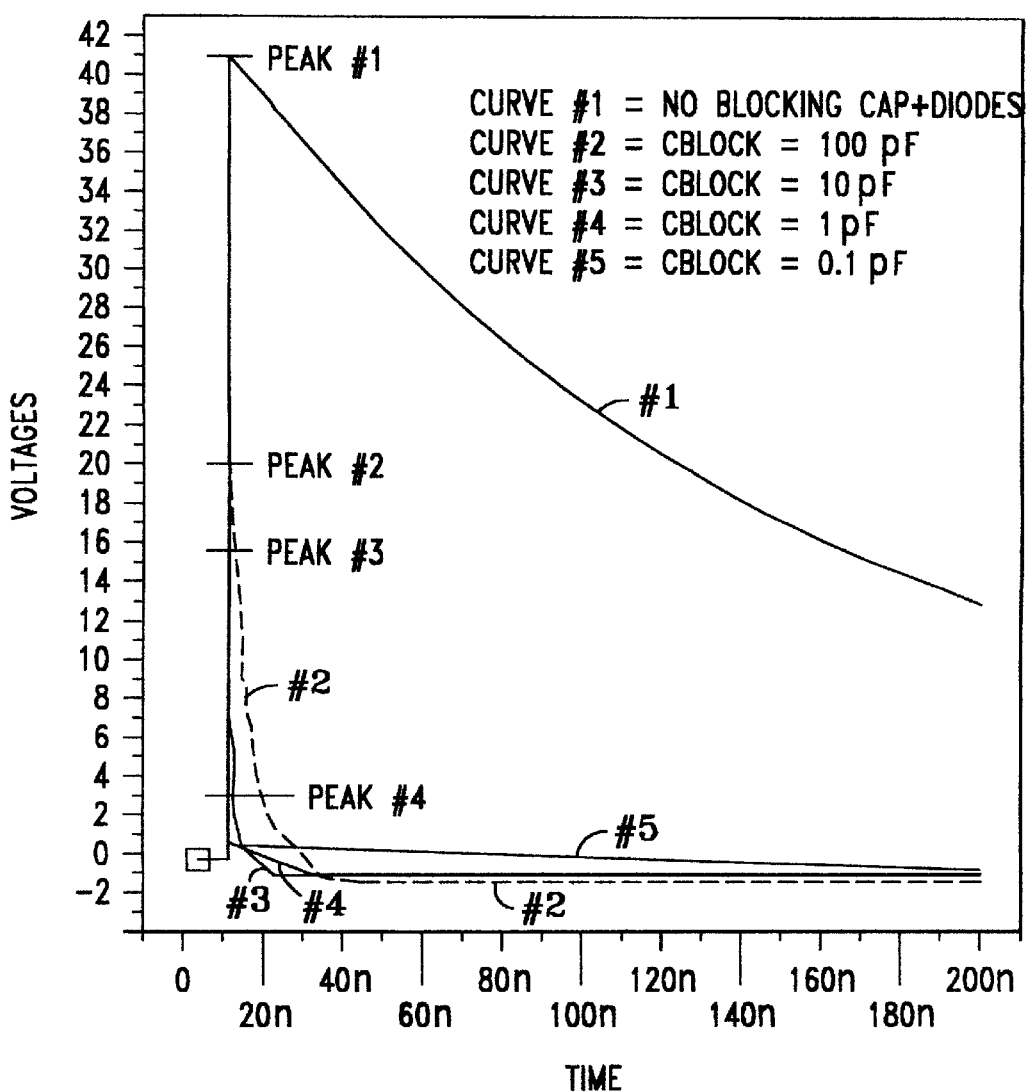
FIG. 7 illustrates ESD pulse reduction using the circuit of FIG. 2.

FIG. 7 illustrates an HBM pulse where the voltage rises linearly until the switch closes (the switch illustrated in the model of FIG. 2) whereafter the voltage decays exponentially. The HBM model assumes precharging a 100 pF capacitor through a 1 MW resistor statically and closing the switch through a 1500W resistor. The current source (of FIG. 2) represents the ESD event. The decay times depend on the size of the capacitors which are selected according to the impedance level required. These capacitors should be selected to provide a high impedance and be effective for the time scales which are slower than the approximately 5 Ghz regime. FIG. 7 also illustrates how a series capacitor can reduce the magnitude of an ESD pulse for capacitance values of 100 pF, 10 pF, 1 pF, and 0.1 pF.

Figure 8:
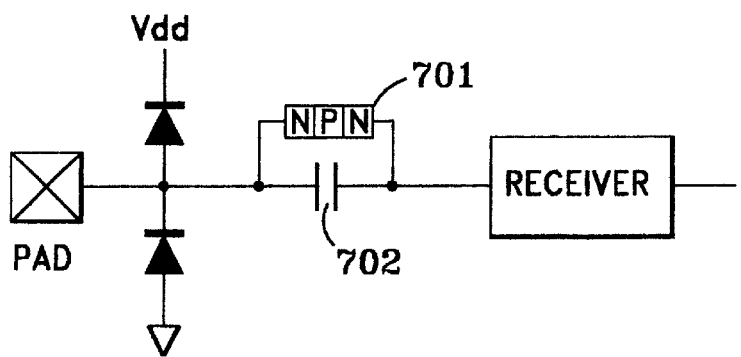
FIG. 8 illustrates an embodiment of the present invention using a DIAC.

FIG. 8 illustrates an implementation of the present invention using a DIAC 701. A DIAC is a bipolar with no base connection. With a large voltage across the DIAC device, it breaks down and allows current to flow. It functions like a filter, but during an ESD event it shorts. It is like an overvoltage element in parallel with the capacitor network 702 to minimize the voltage across the capacitor network. It serves as a means also to protect the overvoltage of the capacitor. In normal operation the DIAC is off. The trigger voltage would be approximately 10V to 100 V.

Figure 9:
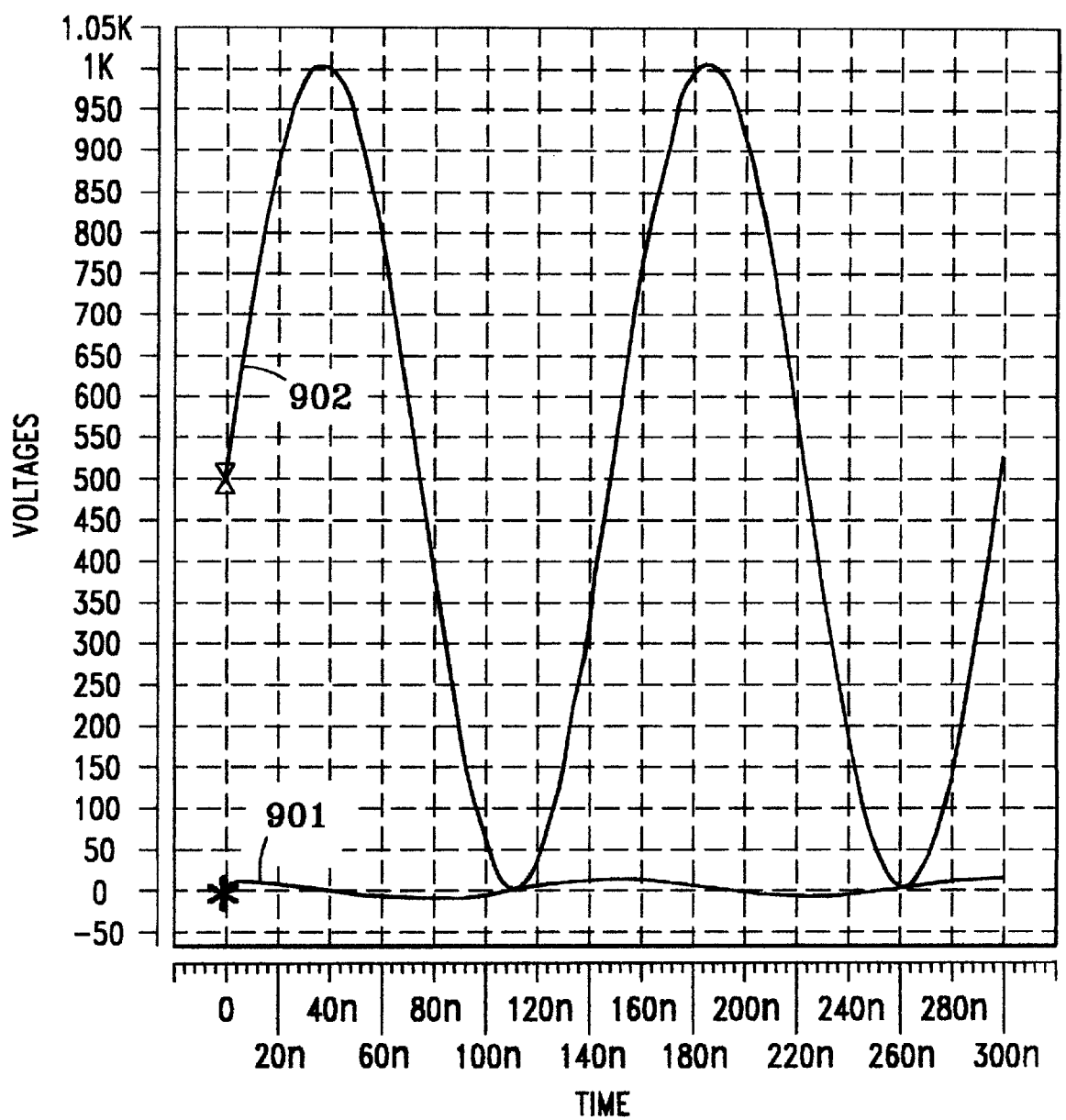
FIG. 9 illustrates a 100x reduction response to ESD frequency inputs using the circuit of FIG. 3.

FIG. 9 illustrates that the network of FIG. 3 is driveable such that the ESD pulse 901 is damped and the signal 902 passes through. Typically, an ESD event is a single shot, but can be oscillatory.

Figure 10:
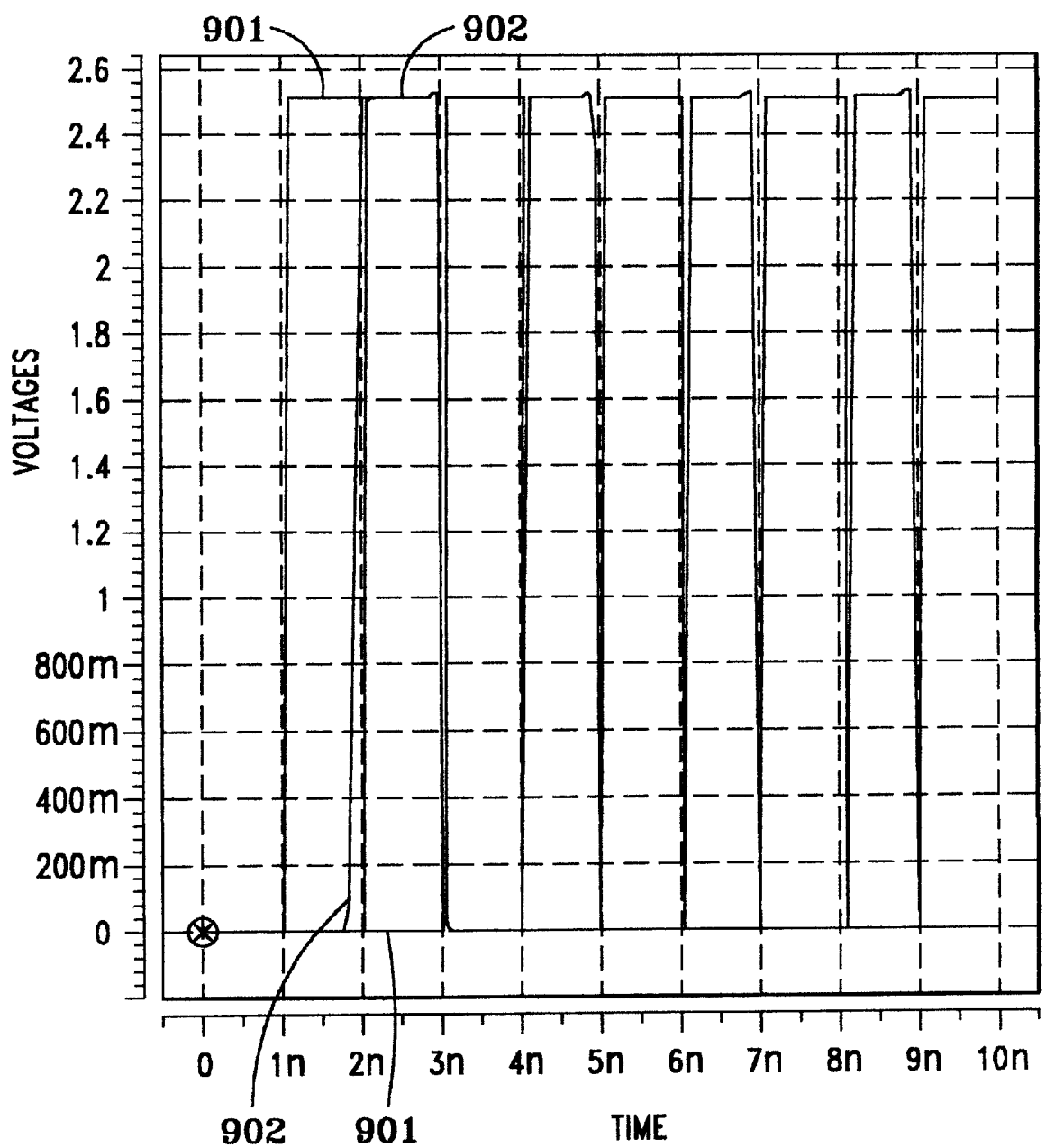
FIG. 10 illustrates a digital response to ESD frequency inputs using the circuit of FIG. 3.

FIG. 10 illustrates that desired digital frequencies can also pass through the circuit of FIG. 3. If a digital signal goes in 901 a digital signal goes out 902. This implementation is frequency selective—it damps the ESD frequency and passes the signals corresponding to the input digital signals.

A possible downside of the circuit of FIG. 3 is that work needs to be done not to reduce the input signal that must be passed. Otherwise, the circuit operates as a straight capacitor divider and every signal (including the input digital signal) is reduced. With reference to FIG. 10, with a frequency selective circuit, frequency components of the digital signal of interest may be filtered out. However, there still exists information that can be recovered by the receiver so the receiver has to be able to look just for those frequencies and respond to them.

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

What is claimed is:

1. A high frequency IC chip comprising:
   an input for receiving input signals, the input subjectable to an ESD event;
   an ESD network coupled to a first supply voltage, a second supply voltage and the input, and having an output coupled to an IC chip receiver for outputting to the IC chip received input signals; and
   the ESD network including a series capacitor between the input and the IC chip receiver.

2. The IC chip of claim 1 wherein a size of the capacitor is selected such that frequencies imposed on the input by an ESD event are attenuated by the capacitor and frequencies of the input signals are passed by the capacitor.

3. The IC chip of claim 1, wherein the first supply voltage comprises VDD and the second supply voltage comprises ground.

4. The IC chip of claim 1, wherein the ESD network comprises a first element having a first terminal coupled to the input and a second terminal coupled to the first supply voltage, and a second element having a third terminal coupled to the input and a fourth terminal coupled to the second supply voltage.

5. The IC chip of claim 4, wherein the first terminal and the third terminal are coupled to the series capacitor.

6. The IC chip of claim 4, wherein the first element comprises a first diode having a first anode coupled to the input and a first cathode coupled to the first supply voltage, and the second element comprises a second diode having a second cathode coupled to the input and a second anode coupled to the second supply voltage.

7. The IC chip of claim 6, wherein the fist or second diode comprises a Schottky diode, a p-i-n diode, a varactor diode, a Mott diode, or a silicon p-n diode.

8. The IC chip of claim 6, wherein the first or second diode comprises an SOI diode, or a dynamic threshold SOI diode.

9. The IC chip of claim 6, wherein the first or second diode comprises a silicon germanium diode, or a silicon germanium transistor in a diode configuration.

10. The IC chip of claim 4 further comprising a third element having a fifth terminal coupled to the series capacitor and a sixth terminal coupled to the first supply voltage, and a fourth element having a seventh terminal coupled to the second supply voltage and an eighth terminal coupled to the series capacitor.

* * * * *